United States Patent [19]

Jessee et al.

[11] Patent Number: 4,728,817
[45] Date of Patent: Mar. 1, 1988

[54] POWER TRANSISTOR DRIVE CIRCUIT

[75] Inventors: Ralph D. Jessee; Joseph M. Urish, both of Shawnee Township, Allen County, Ohio

[73] Assignee: Westinghouse Electric Corp., Pittsburgh, Pa.

[21] Appl. No.: 12,774

[22] Filed: Feb. 9, 1987

[51] Int. Cl.$^4$ .................. H03K 17/60; H03K 3/33; G05F 1/56
[52] U.S. Cl. .................. 307/270; 307/280; 307/315; 307/300; 307/570; 323/289
[58] Field of Search .............. 307/270, 280, 300, 315, 307/570; 323/289

[56] References Cited

U.S. PATENT DOCUMENTS

| | | | |
|---|---|---|---|
| 3,412,316 | 11/1968 | Kernick | 321/45 |
| 3,697,783 | 10/1972 | Seager | 307/315 |
| 3,715,648 | 2/1973 | Kernick et al. | 321/45 |
| 4,239,589 | 12/1980 | Brajder | 323/289 |
| 4,342,076 | 7/1982 | Rosswurm et al. | 363/56 |
| 4,453,089 | 6/1984 | Shuey et al. | 307/300 |

Primary Examiner—Stanley D. Miller
Assistant Examiner—B. P. Davis
Attorney, Agent, or Firm—R. P. Lenart

[57] ABSTRACT

A transistor drive circuit includes a driver transistor and a power switching transistor connected in a Darlington configuration which receives turn-on and turn-off signals from a drive transformer. A capacitor is provided for connection between the driver transistor base and the switching transistor emitter during a turn-off period such that the voltage on the capacitor hastens turn-off of the driver transistor and the switching transistor. A diode connected between the emitter and the base of the driver transistor provides for continuing current flow from the capacitor following turn-off of the driver transistor but prior to turn-off of the switching transistor. After the switching transistor has turned off, the capacitor is recharged prior to the presence of a turn-on signal from the drive transformer.

12 Claims, 2 Drawing Figures

POWER TRANSISTOR DRIVE CIRCUIT

BACKGROUND OF THE INVENTION

This invention relates to power transistor switching circuitry and, more particularly, to such circuitry which is used in the output stage of apparatus such as power inverters.

Drive circuits for power transistors operating in the switching mode must supply ample drive current to assure low voltage drop during the ON state and must provide means for causing fast turn-off of the power transistor. A known way of controllably and reliably applying base drive current to transistors operating in a high current, switching mode is by the use of a current controlled feedback transformer drive circuit. However, with such a circuit, the relatively high drive current requirements and the necessary fast turn-off circuitry may result in bulky circuit configurations in which stray inductance can cause severe voltage spikes during switching.

Electronic inverters commonly include a plurality of output transistor switches connected in a bridge arrangement. Output power poles are formed between a pair of power switching transistors which are electrically connected in series between a pair of DC conductors. When switching the transistors connected to a single inverter output power pole, it is important to use caution to avoid turning on a transistor while its counterpart is capable of conduction. This is sometimes accomplished by providing an underlap in the control signals. While this works fairly well, it can produce periods where the pole is not conductive and therefore at an undetermined voltage. Thus, it is desirable to provide an interlock to inhibit turn-on of either transistor until the other is positively off.

SUMMARY OF THE INVENTION

The circuits of the present invention provide the required turn-on and fast turn-off characteristics and are capable of being compactly configured, thereby providing minimum lead length in the high current portion of the circuit and small stray inductances. When used in an inverter output circuit, a simple current cross-feed scheme is used to prevent simultaneous conduction of two power transistors associated with a single inverter output pole.

Circuits constructed in accordance with the present invention include a power switching transistor having a base, an emitter, and a collector. A driver transistor is connected in a Darlington configuration with the power switching transistor with the collector of the driver transistor being connected to the switching transistor collector and the emitter of the driving transistor being connected to the switching transistor base. Turn-on and turn-off pulses are provided by a drive transformer. A capacitor is connected to the drive transformer to charge during a turn-on pulse. During a turn-off pulse, a solid state switching device connects the capacitor between the driver transistor base and the switching transistor emitter, such that the voltage on the capacitor hastens turn-off of the driver transistor and the switching transistor. Since the driver transistor can be expected to turn off before the switching transistor, means is provided for continuing current flow from the capacitor following turn-off of the driver transistor but prior to turn-off of the switching transistor.

When the present invention is used in the output circuit of an inverter, means is provided for producing a signal representative of current flow from the capacitor associated with one of the power switching transistors. That signal is used to prevent the application of a turn-on pulse to the complementary switching transistor until the first switching transistor has positively turned off.

DESCRIPTION OF THE PREFERRED EMBODIMENTS

Figure 1:
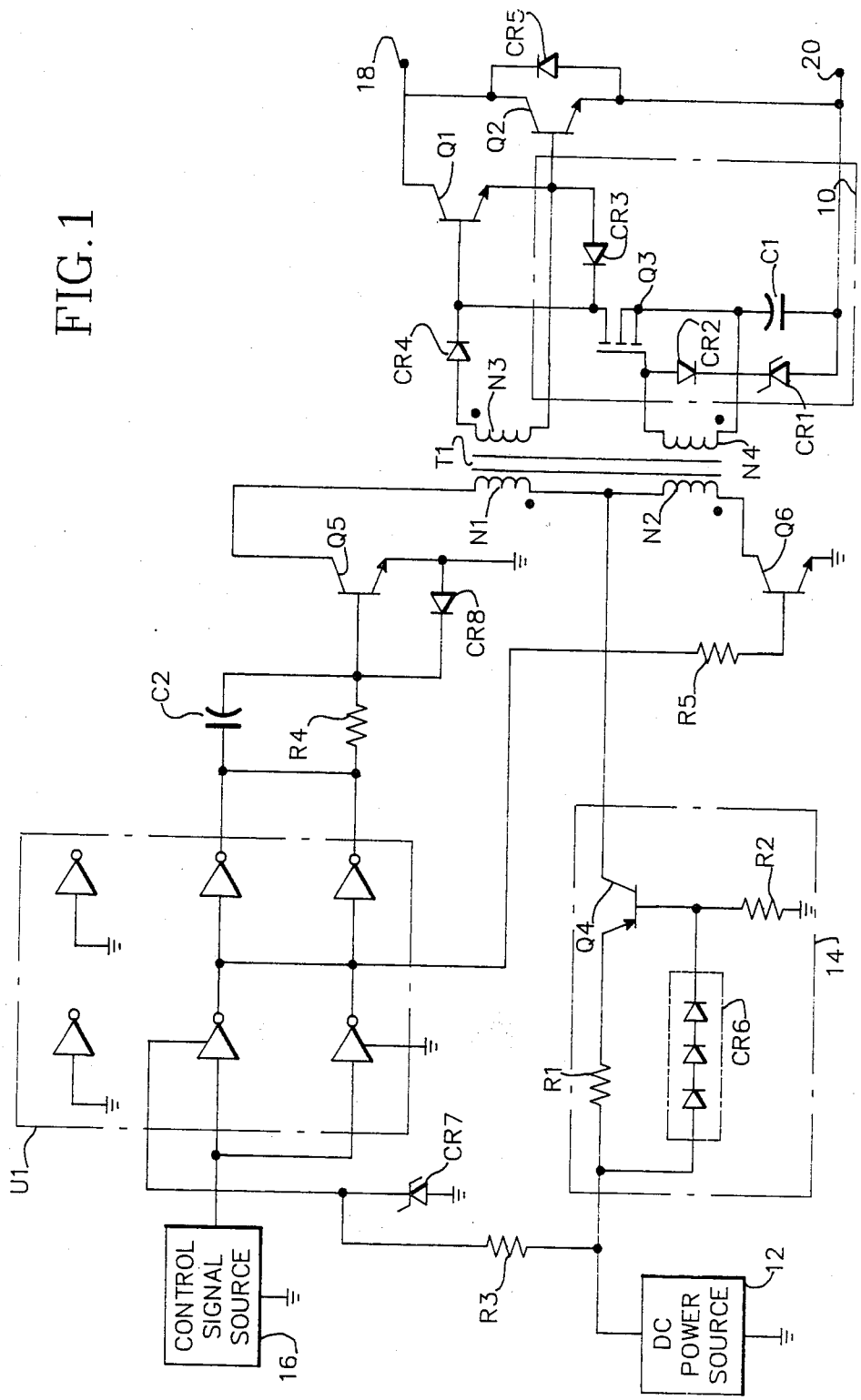
FIG. 1 is a schematic diagram of a power transistor drive circuit constructed in accordance with one embodiment of the present invention.

Referring to the drawings, FIG. 1 is a schematic diagram of a power transistor drive circuit constructed in accordance with one embodiment of the present invention. In this circuit, a drive transistor Q1 is connected in a Darlington configuration with a power switching transistor Q2 such that the collector of the transistor Q1 is connected to the collector of transistor Q2 and the emitter of transistor Q1 is connected to the base of transistor Q2. A switchable energy storage circuit 10 comprising field effect transistor Q3, capacitor C1, and diodes CR1, CR2 and CR3, is provided for enhancing turn-off of transistors Q1 and Q2. Transformer T1 is connected to supply drive current to transistor Q1, control voltage to transistor Q3, and charge current to capacitor C1. Transformer T1 also provides isolation between the power circuit and the control circuit. A DC power source 12, is connected to the primary windings, N1 and N2 of transformer T1 through a current limiting circuit 14, which includes transistor Q4, resistors R1 and R2, and diode array CR6. A control signal source 16 provides control pulses to an inverter array U1 which is used to alternately drive transistors Q5 and Q6.

The operation of the circuit of FIG. 1 will now be described by initially assuming that transistor Q6 is ON and conducting current from the current limited supply through transistor Q4 and that the transformer T1 is saturated. Since no drive current flows, transistors Q1 and Q2 are OFF. When the control signal is brought to a logic high level, transistor Q5 turns on and transistor Q6 turns off. This drives the transformer out of saturation and supplies a controlled amount of current to the base of transistor Q1 turning it on. Current can now flow to the base of the power transistor Q2 turning it on via the Darlington connection. Meanwhile, the field effect transistor Q3 is held off by a negative voltage provided on the output of transformer secondary winding N4. For proper operation, the circuit must be turned off before the transformer saturates in the ON direction. Assuming this to be the case, when a logic low level control signal turns transistor Q5 off and transistor Q6 on, the transformer secondaries reverse polarity providing a positive voltage which turns on field effect transistor Q3. Reverse current through transformer secondary winding N3 is blocked by diode CR4 to avoid the secondary winding being short circuited. A short circuit would prevent voltage buildup on secondary winding N4 which supplies turn-on voltage to field effect transistor Q3. Turning on Q3 completes a circuit from capacitor C1, which is normally charged, through the emitter-base junctions of both transistors Q2 and Q1. The resulting reverse current aids in turning off transistor Q1 rapidly, then continues to flow through diode CR3 until transistor Q2 turns off.

Reverse base current sweeps the carrier charge from the power transistor Q2, greatly enhancing its turn-off speed. During the turn-off period, the capacitor current is augmented by current through diodes CR1 and CR2 from transformer winding N4. This current continues to flow after transistor Q2 turns off and thereby recharges capacitor C1. The maximum capacitor voltage is fixed by the zener voltage of diode CR1 and the no load voltage of the current limited source at the collector of transistor Q4. Diode CR1 allows the proper voltage levels on both the gate of field effect transistor Q3 and capacitor C1. The transformer subsequently saturates returning the circuit to its initial state. Then transistors Q1 and Q2 have no base drive and remain in the OFF state until the control signal is once again brought high.

In order to provide a more complete description of the invention, Table I includess a list of components used to construct the circuit of FIG. 1.

TABLE I

COMPONENT SPECIFICATIONS FOR FIG. 1

| Item | Type |
|------|------|
| Q1 | Solitron DEIJ107 |
| Q2 | WESTCODE WT5605 |
| Q3 | IRF 151 |
| Q4 | 2N3741 |
| Q5 | 2N3019 |
| Q6 | 2N3019 |
| U1 | MC14049B |
| C1 | 100 μfd |
| C2 | 820 pfd |
| R1 | 7.5 Ω |
| R2 | 2.4K |
| R3 | 150 Ω |
| R4 | 1.0K |
| R5 | 1.0K |
| N1 | 140 T |
| N2 | 70 T |
| N3 | 10 T |
| N4 | 32 T |
| CR1 | 5.6 V |
| CR2 | 1N5615 |
| CR3 | UES1101 |
| CR4 | 1N5820 |
| CR5 | MR876 |
| CR6 | GE R794 |
| CR7 | GE R794 |
| CR8 | GE R794 |

Figure 2:
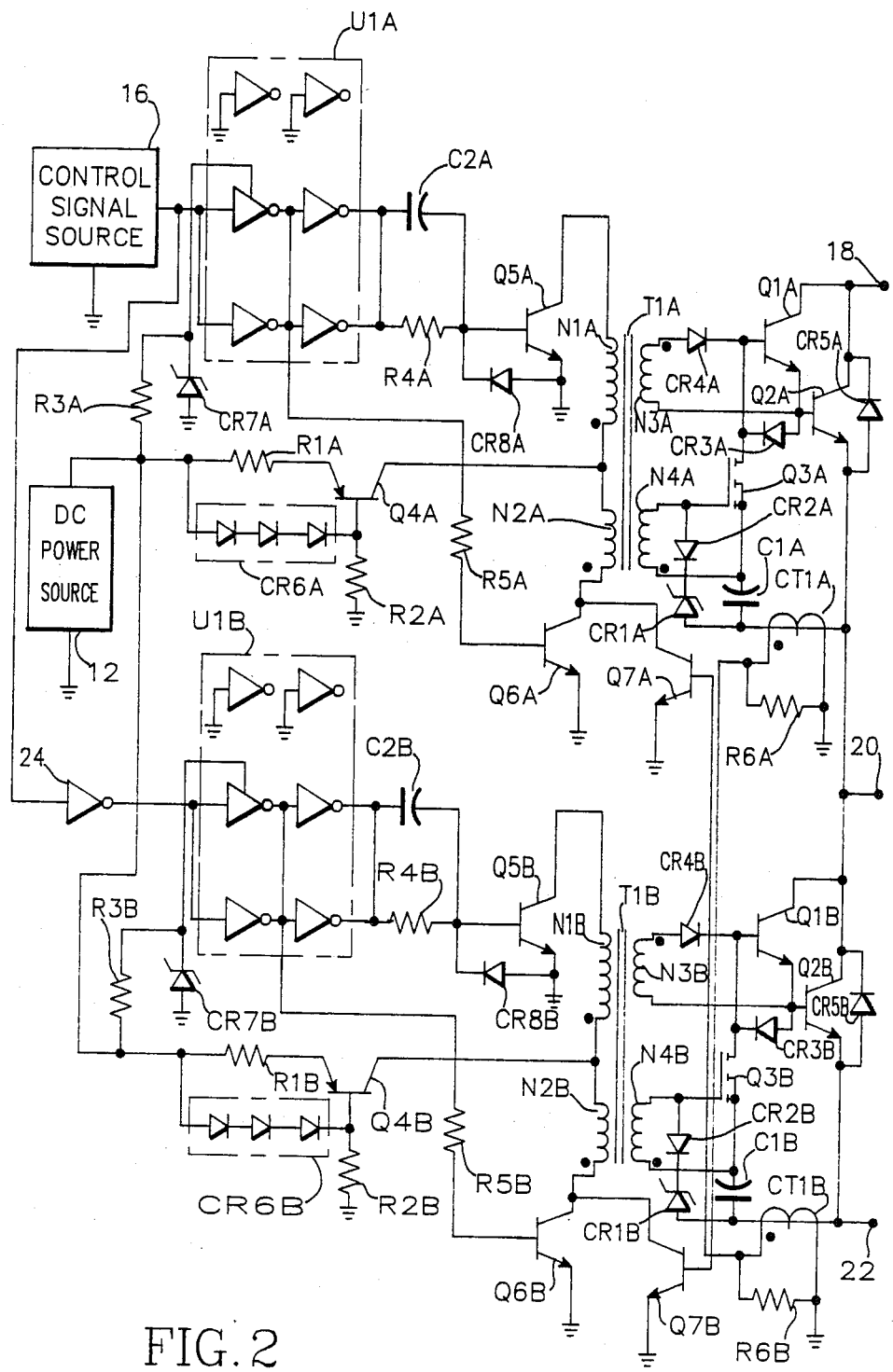
FIG. 2 is a schematic diagram of a portion of an inverter output power pole circuit constructed in accordance with an alternative embodiment of the present invention.

FIG. 2 is a schematic diagram of an inverter pole output circuit constructed in accordance with an alternative embodiment of the present invention. DC power is supplied to terminals 18 and 22 by an external source. This circuit uses a simple current cross-feed scheme to prevent simultaneous conduction of the power transistors Q2A and Q2B. Once a turn-off signal is established, current flows unidirectionally through the capacitor C1A or C1B, until the associated power transistor base current is depleted and that power transistor is off. Capacitor current is then reversed during recharge.

To illustrate the operation of the circuit of FIG. 2, suppose that transistor Q2B is initially off and transistor Q2A is on, thereby supplying positive voltage to a load by way of terminal 20. Now let the output of control signal source 16 change from a logic high to a logic low level. This results in transistor Q5A turning off, enhanced by the voltage on capacitor C2A. Transistors Q6A and Q5B turn on. Transistor Q6B receives a turn-off signal, but because it is in the saturated on state and its carrier charges must escape through its base resistor R5B, its turn-off is delayed. So long as transistor Q6B (or Q7B) is on, no base current can flow to transistor Q1B, so Q2B remains off. Meanwhile transistor Q2A is being turned off by the discharge of capacitor C1A. This capacitor discharge current is sensed by current transformer CT1A which produces a signal that turns on transistor Q7B, thereby keeping the primaries of transformer T1B short circuited and inhibiting base current to transistor Q1B. Subsequently, transistor Q6B turns off, but transistor Q7B is still on. Once transistor Q2A is off, the current in capacitor C1A reverses, transistor Q7B turns off and allows transistor Q2B to be turned on. Similar action takes place, of course, in turning transistor Q2B off and Q2A on. Thus a single control signal from a control signal source can operate an inverter pole without producing "shoot through" conditions.

While the present invention has been described in terms of what are at present believed to be its preferred embodiments, it will be apparent to those skilled in the art that various changes may be made without departing from the scope of the invention. For example, the functions of transistors Q6A and Q7A or Q6B and Q7B, may be combined by injecting the appropriate current transformer output signal into the base of transistor Q6A or Q6B, thus eliminating the need for transistor Q7A or Q7B. It should also be apparent that other types of switches such as field effect transistors may be substituted for the transistors which are connected to the transformer primaries. It is therefore intended that the appended claims cover such modifications.

We claim:

1. A transistor drive circuit comprising:
    a power switching transistor having a base, an emitter, and a collector;
    a driver transistor having a base, an emitter, and a collector, wherein the driver transistor collector is connected to the switching transistor collector and the driver transistor emitter is connected to the switching transistor base;
    means for providing turn-on and turn-off pulses;
    means for coupling said turn-on pulses to said driver transistor base;
    a capacitor;
    means for connecting said capacitor between said driver transistor base and said switching transistor emitter when said turn-off pulse is present, wherein the voltage on said capacitor hastens turn-off of said driver transistor and said switching transistor;
    means for continuing current flow in said capacitor following turn-off of said driver transistor but prior to turn-off of said switching transistor; and
    means for charging said capacitor following turn-off of said switching transistor.

2. A transistor drive circuit as recited in claim 1, wherein said means for continuing current flow comprises:
    a diode connected between said driver transistor base and said driver transistor emitter.

3. A transistor drive circuit as recited in claim 1, wherein:
    a first terminal of said capacitor is connected to said switching transistor emitter; and said means for connecting includes a solid state switching device connected between a second terminal of said capacitor and said driver transistor base.

4. A transistor drive circuit as recited in claim 1, wherein said means for providing turn-on and turn-off pulses comprises:
   a transformer having a primary winding and first and second secondary windings; and
   wherein said means for charging said capacitor includes said first secondary winding and a unidirectional device connected in series with said capacitor.

5. A transistor drive circuit as recited in claim 4, further comprising:
   a diode connected in series with said second secondary winding and said driver transistor.

6. A transistor drive circuit as recited in claim 4, further comprising:
   a zener diode connected in series with said first secondary winding and said capacitor.

7. A transistor drive circuit as recited in claim 4, further comprising:
   means for providing current pulses of opposite polarity to portions of said primary winding.

8. A transistor drive circuit as recited in claim 1, wherein said means for connecting comprises:
   a solid state switch electrically connected in series with said capacitor, and responsive to said turn off pulse.

9. A transistor drive circuit comprising:
   a first power switching transistor having a base, an emitter, and a collector;
   a first driver transistor having a base, an emitter, and a collector, wherein the first driver transistor collector is connected to the first switching transistor collector and the first driver transistor emitter is connected to the first switching transistor base;
   means for providing first turn-on and first turn-off pulses;
   means for coupling said first turn-on pulses to said first driver transistor base;
   a first capacitor;
   means for connecting said first capacitor between said first driver transistor base and said first switching transistor emitter when said first turn-off pulse is present, wherein the voltage on said first capacitor hastens turn-off of said first driver transistor and said first switching transistor;
   means for continuing current flow in said first capacitor following turn-off of said first driver transistor but prior to turn-off of said first switching transistor;
   means for charging said first capacitor following turn-off of said first switching transistor;
   a second power switching transistor having a base, an emitter, and a collector;
   a second driver transistor having a base, an emitter, and a collector, wherein the second driver transistor collector is connected to the second switching transistor collector and the second driver transistor emitter is connected to the second switching transistor base;
   means for providing second turn-on and second turn-off pulses;
   means for coupling said second turn-on pulses to said second driver transistor base;
   a second capacitor;
   means for connecting said second capacitor between said second driver transistor base and said second switching transistor emitter when said second turn-off pulse is present, wherein the voltage on said second capacitor hastens turn-off of said second driver transistor and said second switching transistor;
   means for continuing current flow in said second capacitor following turn-off of said second driver transistor but prior to turn-off of said second switching transistor; and
   means for charging said second capacitor following turn-off of said second switching transistor.

10. A transistor drive circuit as recited in claim 9, further comprising:
    means for preventing said second turn-on pulse when current is flowing in said first capacitor in a preselected direction.

11. A transistor drive circuit as recited in claim 10, wherein said means for preventing includes:
    a current transformer for producing a signal representative of current flowing in said first capacitor.

12. A transistor drive circuit as recited in claim 11, wherein said means for preventing further includes:
    a solid state switching device responsive to said signal representative of current flowing in said first capacitor.

* * * * *